(12) United States Patent
Hack et al.

(10) Patent No.: US 9,978,965 B2
(45) Date of Patent: May 22, 2018

(54) ROLLABLE OLED DISPLAY

(71) Applicant: Universal Display Corporation, Ewing, NJ (US)

(72) Inventors: Michael Hack, Ewing, NJ (US); Ruiqing Ma, Ewing, NJ (US)

(73) Assignee: Universal Display Corporation, Ewing, NJ (US)

( * ) Notice: Subject to any disclaimer, the term of this patent is extended or adjusted under 35 U.S.C. 154(b) by 0 days. days.

(21) Appl. No.: 15/181,835

(22) Filed: Jun. 14, 2016

(65) Prior Publication Data

US 2016/0372690 A1    Dec. 22, 2016

Related U.S. Application Data

(60) Provisional application No. 62/180,885, filed on Jun. 17, 2015.

(51) Int. Cl.
*H01L 51/52* (2006.01)
*H01L 51/00* (2006.01)
*H01L 27/32* (2006.01)

(52) U.S. Cl.
CPC ...... *H01L 51/0097* (2013.01); *H01L 27/3276* (2013.01); *H01L 51/5253* (2013.01); *H01L 2251/5338* (2013.01); *H01L 2251/556* (2013.01); *Y02E 10/549* (2013.01)

(58) Field of Classification Search
CPC . H01L 51/52; H01L 51/5253; H01L 51/0097; H01L 27/3276
See application file for complete search history.

(56) References Cited

U.S. PATENT DOCUMENTS

| | | | |
|---|---|---|---|
| 4,769,292 A | 9/1988 | Tang et al. |
| 5,247,190 A | 9/1993 | Friend et al. |
| 5,703,436 A | 12/1997 | Forrest et al. |
| 5,707,745 A | 1/1998 | Forrest et al. |
| 5,834,893 A | 11/1998 | Bulovic et al. |
| 5,844,363 A | 12/1998 | Gu et al. |
| 6,013,982 A | 1/2000 | Thompson et al. |
| 6,087,196 A | 7/2000 | Sturm et al. |

(Continued)

FOREIGN PATENT DOCUMENTS

| | | |
|---|---|---|
| EP | 1238981 | 9/2002 |
| JP | 2010/135467 | 6/2010 |

(Continued)

OTHER PUBLICATIONS

Kazumasa et al., "Rollable OLED Display Driven by Organic TFTs", 2011, SID Symposium Digest of Technical Papers, 42: 488-491.

(Continued)

*Primary Examiner* — Phuc Dang
(74) *Attorney, Agent, or Firm* — Riverside Law LLP

(57) ABSTRACT

A rollable display includes a frontplane having multiple OLED pixels and a backplane having a flexible substrate. The flexible substrate has a perimeter and a thin film transistor array operably connected to the OLED pixels. At least one rigid band of drivers is operably connected to the backplane and positioned along an edge of the substrate perimeter. The flexible substrate includes a material having a glass transition temperature of less than 200 degrees Celsius. A method of fabricating a rollable display is also disclosed.

18 Claims, 4 Drawing Sheets

(56) References Cited

U.S. PATENT DOCUMENTS

| | | | |
|---|---|---|---|
| 6,091,195 | A | 7/2000 | Forrest et al. |
| 6,097,147 | A | 8/2000 | Baldo et al. |
| 6,294,398 | B1 | 9/2001 | Kim et al. |
| 6,303,238 | B1 | 10/2001 | Thompson et al. |
| 6,337,102 | B1 | 1/2002 | Forrest et al. |
| 6,468,819 | B1 | 10/2002 | Kim et al. |
| 6,844,673 | B1* | 1/2005 | Bernkopf ............ H01L 27/3253 313/498 |
| 7,279,704 | B2 | 10/2007 | Walters et al. |
| 7,431,968 | B1 | 10/2008 | Shtein et al. |
| 7,968,146 | B2 | 6/2011 | Wanger et al. |
| 2003/0230980 | A1 | 12/2003 | Forrest et al. |
| 2004/0174116 | A1 | 9/2004 | Lu et al. |
| 2004/0262605 | A1* | 12/2004 | Park ...................... H01L 51/524 257/59 |
| 2007/0209303 | A1* | 9/2007 | Shoda .................... H01L 51/50 52/204.593 |
| 2009/0027584 | A1* | 1/2009 | Han .................. G02F 1/133608 349/58 |
| 2012/0074217 | A1* | 3/2012 | Block ................. G06Q 20/327 235/379 |
| 2013/0026452 | A1 | 1/2013 | Kottas et al. |
| 2013/0119354 | A1 | 5/2013 | Ma et al. |
| 2015/0167152 | A1* | 6/2015 | Young ................. H01L 51/0021 204/192.1 |
| 2015/0200441 | A1* | 7/2015 | Rivera ..................... H01Q 1/22 343/702 |
| 2016/0293099 | A1 | 10/2016 | Hack |
| 2016/0315129 | A1 | 10/2016 | Hack |

FOREIGN PATENT DOCUMENTS

| | | |
|---|---|---|
| WO | 2004/111066 | 12/2004 |
| WO | 2008/044723 | 4/2008 |
| WO | 2008057394 | 5/2008 |
| WO | 2010011390 | 1/2010 |
| WO | 2010/111175 | 9/2010 |

OTHER PUBLICATIONS

Baldo et al., "Highly Efficient Phosphorescent Emission from Organic Electroluminescent Devices," Nature, vol. 395, 151-154, (1998).

Baldo et al., "Very high-efficiency green organic light-emitting devices based on electrophosphorescence," Appl. Phys. Lett., vol. 75, No. 1, 4-6 (1999).

* cited by examiner

ROLLABLE OLED DISPLAY

CROSS-REFERENCE TO RELATED APPLICATIONS

This application is a non-provisional of U.S. Patent Application Ser. No. 62/180,885, filed Jun. 17, 2015, the entire contents of which is incorporated herein by reference.

PARTIES TO A JOINT RESEARCH AGREEMENT

The claimed invention was made by, on behalf of, and/or in connection with one or more of the following parties to a joint university corporation research agreement: Regents of the University of Michigan, Princeton University, University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to rollable OLED displays and devices such as organic light emitting diodes and other devices, including the same.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted Ir(ppy)$_3$, which has the following structure:

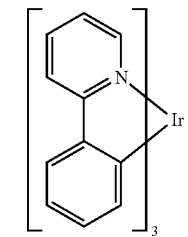

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher"

HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

Conventional flat screen displays such as televisions are often made on a glass substrate, and display sizes have grown recently with 55" to 77" being a common size. While flat screen displays are still much lighter than CRTs, large flat screen televisions are difficult to ship, particularly from retailer to consumer. Recent advances allow for the manufacture of rollable OLED displays, but their performance and cost has yet to be developed and optimized to the point of widespread commercial adoption for large area televisions. Many challenges remain in making rollable OLED TVs, both with making the display itself, how the display would be mounted for viewing, and also how it can be shipped.

Currently, fabrication of a rollable OLED display requires a rollable substrate, preferably a thin metal or plastic. If plastic, the substrate needs to be encapsulated with a permeation barrier to prevent oxygen or moisture from entering the package and degrading the organic materials. On top of the substrate, a thin film transistor (TFT) backplane needs to be formed to control the current flowing to each sub-pixel in the OLED frontplane. Bus lines are required to provide power to the OLED devices in the display, and in general, for large sized displays, low resistance metals will be needed to ensure low ohmic losses along these buslines. The overall display is therefore an integration of a substrate (preferably plastic), islands of TFTs (organic or inorganic) and the OLED pixels, together with encapsulation and possibly touch functionality, along with any optical films to improve outcoupling or reduce reflections etc, such as circular polarizers. The display is therefore a composite of many inorganic and organic materials, each with its own and very different coefficient of thermal expansion. So as the temperature of the display changes, either during fabrication or through use, stresses and strains will build up in this complex stack. Cracking and delamination issues are particularly exacerbated as the display is flexed or rolled, especially at small radii of curvature.

Thus, what is needed in the art is an improved display architecture that is rollable, light weight, easy to use, and reduces shipping costs while minimizing the stresses and strains that lead to the cracking and delamination of the display.

SUMMARY OF THE INVENTION

According to an embodiment, a rollable display includes a frontplane having a plurality of OLED pixels, a backplane having a flexible substrate having a perimeter and a thin film transistor array operably connected to the plurality of OLED pixels, and at least one rigid band of drivers operably connected to the backplane and positioned along or near an edge of the substrate perimeter, where the flexible substrate includes a material having a glass transition temperature of less than 200 degrees Celsius. In one embodiment, the at least one rigid band comprise a material having a rigidity that is greater than the backplane substrate. In one embodiment, the width of the at least one rigid band is less than one inch. In one embodiment, the at least one rigid band of drivers comprises a first rigid band of drivers positioned along an edge of the substrate perimeter and a second rigid band of drivers positioned along an edge of the substrate perimeter. In one embodiment, the second rigid band of drivers is parallel to the first band of rigid drivers. In one embodiment, the first rigid band of drivers comprise data driver chips. In one embodiment, the second rigid band of drivers comprise chips for video processing, connectivity, and timing control. In one embodiment, the flexible substrate comprises a thin metal. In one embodiment, the flexible substrate comprises plastic. In one embodiment, a permeation barrier disposed between the backplane and the frontplane. In one embodiment, the display includes an active area of at least 40 inches diagonal. In one embodiment, the display is capable of being rolled around an axis parallel to the length of the at least one rigid band of drivers to a diameter of less than 8 inches. In one embodiment, the display is capable of being rolled around an axis parallel to the length of the at least one rigid band of drivers to a diameter of less than 6 inches. In one embodiment, the display has three or less external connections. In one embodiment, the display is greater than 50 dpi. In one embodiment, the flexible substrate includes a material having a glass transition temperature of less than 180 degrees Celsius. In one embodiment, the thin film transistor array comprises organic thin film transistors. In one embodiment, the thin film transistor array comprises low temperature oxide or carbon nanotube thin film transistors. In one embodiment, a product including the display is selected from the group consisting of: a flat panel display, a computer monitor, a medical monitor, a television, a touchscreen, a retractable projector screen, a billboard, a general illumination device, a signal, a heads up display, a fully transparent display, a large area wall, a theater, a stadium screen, and a sign.

In one embodiment, a method of fabricating a rollable display includes the steps of forming a backplane circuit comprising a thin film transistor array on a flexible substrate, forming a frontplane comprising a plurality of OLED pixels, forming at least one rigid band of drivers along an edge of the substrate perimeter, operably connecting the plurality of OLED pixels to the thin film transistor array, and operably connecting the at least one rigid band of drivers to the backplane circuit, where the rollable display is fabricated at a temperature of less than 200 degrees Celsius. In one embodiment, the method includes disposing a barrier layer between the frontplane and the backplane circuit. In one embodiment, the method includes the step of planarizing the backplane circuit. In one embodiment, the method includes the step of passivating the backplane circuit. In one embodiment, the method includes the step of disposing a thin film barrier over the plurality of OLED pixels. In one embodiment, the method includes the step of forming at least one rigid band of drivers comprises forming a first rigid band of drivers positioned along an edge of the substrate perimeter and forming a second rigid band of drivers positioned along an edge of the substrate perimeter opposing the first rigid band of drivers. In one embodiment, the at least one rigid band includes a material having a rigidity that is greater than the backplane substrate. In one embodiment, the method includes the width of the at least one rigid band is less than one inch. In one embodiment, the method includes the display includes an active area of at least 40 inches diagonal. In one embodiment, the display is capable of being rolled around an axis parallel to the length of the at least one rigid band of drivers to a diameter of less than 8 inches. In one embodiment, the method includes the display is capable of being rolled around an axis parallel to the length of the at least one rigid band of drivers to a diameter of less than 6 inches. In one embodiment, the method includes the display has three or less external connections. In one embodiment, the method includes the display is greater than 50 dpi. In one embodiment, the display is fabricated at a temperature of less than 180 degrees Celsius.

DETAILED DESCRIPTION

Figure 1:
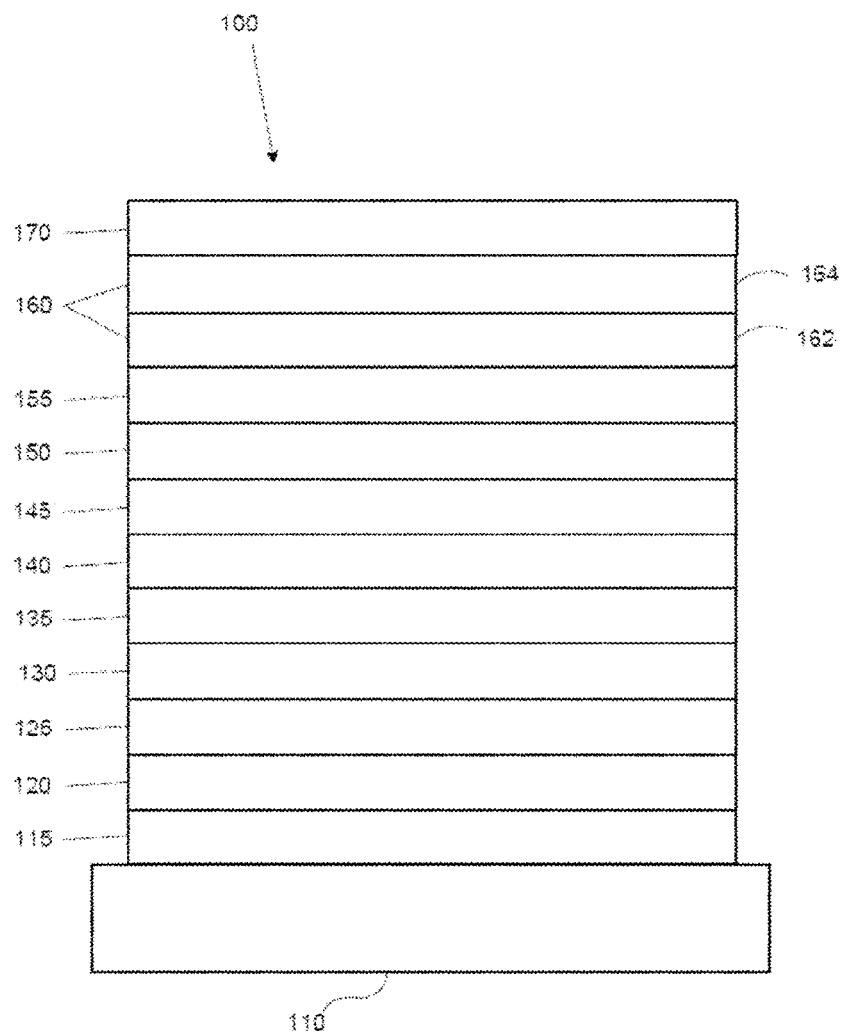
FIG. 1 shows an organic light emitting device.

It is to be understood that the figures and descriptions of the present invention have been simplified to illustrate elements that are relevant for a more clear comprehension of the present invention, while eliminating, for the purpose of clarity, many other elements found in rollable displays. Those of ordinary skill in the art may recognize that other elements and/or steps are desirable and/or required in implementing the present invention. However, because such elements and steps are well known in the art, and because they do not facilitate a better understanding of the present invention, a discussion of such elements and steps is not provided herein. The disclosure herein is directed to all such variations and modifications to such elements and methods known to those skilled in the art.

Unless defined otherwise, all technical and scientific terms used herein have the same meaning as commonly understood by one of ordinary skill in the art to which this invention belongs. Although any methods and materials similar or equivalent to those described herein can be used in the practice or testing of the present invention, the preferred methods and materials are described.

As used herein, each of the following terms has the meaning associated with it in this section.

The articles "a" and "an" are used herein to refer to one or to more than one (i.e., to at least one) of the grammatical object of the article. By way of example, "an element" means one element or more than one element.

"About" as used herein when referring to a measurable value such as an amount, a temporal duration, and the like, is meant to encompass variations of ±20%, ±10%, ±5%, ±1%, and ±0.1% from the specified value, as such variations are appropriate.

Ranges: throughout this disclosure, various aspects of the invention can be presented in a range format. It should be understood that the description in range format is merely for convenience and brevity and should not be construed as an inflexible limitation on the scope of the invention. Where appropriate, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 2.7, 3, 4, 5, 5.3, and 6. This applies regardless of the breadth of the range.

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
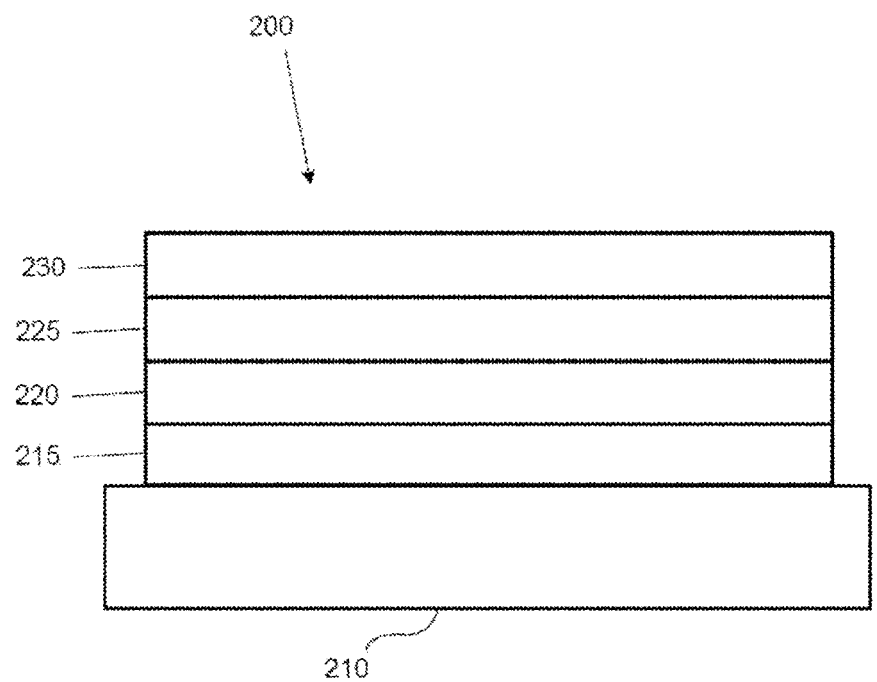
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, laser printers, telephones, cell phones, tablets, phablets, personal digital assistants (PDAs), laptop computers, digital cameras, camcorders, viewfinders, micro-displays, 3-D displays, virtual reality displays, augmented reality displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.), but could be used outside this temperature range, for example, from −40 degree C. to +80 degree C.

Figure 3:
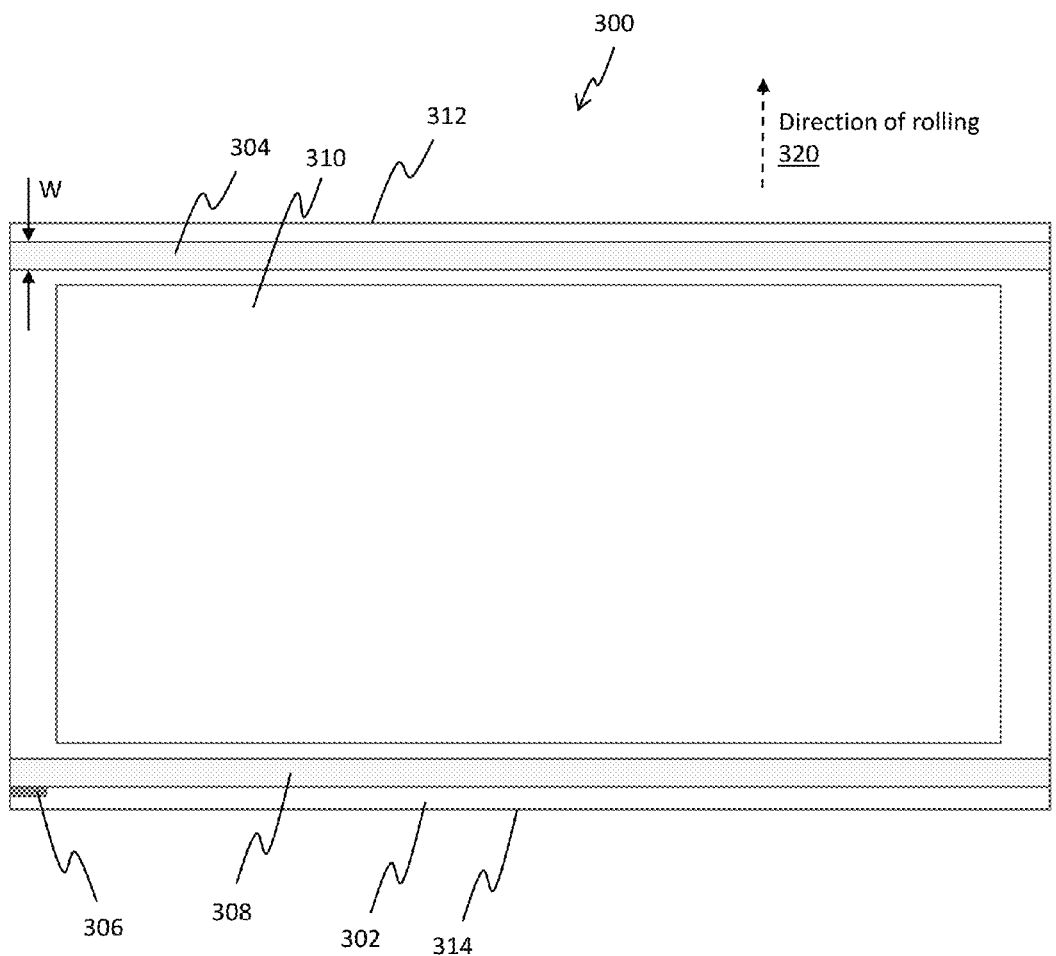
FIG. 3 is a schematic of a rollable OLED display according to one embodiment.

With reference now to FIG. 3, a rollable display 300 is shown according to one embodiment. A frontplane includes multiple OLED pixels that make up a display active area 310. The backplane includes a flexible substrate 302 having a perimeter 312. A thin film transistor array in the backplane is operably connected to the plurality of OLED pixels in the frontplane. A row of drivers can be can be integrated into the TFT backplane. In one embodiment, at least one rigid band 304 includes multiple drivers operably connected to the backplane and positioned along an edge of the substrate perimeter 312. By way of example, for a conventional RGB 4K×2K TV, there are approximately 12,000 data connections, and so the data drivers must be integrated onto the flexible display 300. Reliable connections from the data chips must be ensured, especially since the substrate 302 is flexible and may be rolled. Thus in certain embodiments, the data driver chips have a maximum height so as not to prevent the display from rolling. In certain embodiments, the data driver chips have a height of less than 5 mm. To avoid putting stress on the connections to the data drivers, they may be placed in a rigid band 304 across the display by attaching a piece of thin rigid material to the display 300 in a band 304 positioned perpendicular to the direction of rolling 320. The rigid band can include a material having a rigidity that is greater than the backplane substrate 312. In some embodiments, the rigidity is provided by attaching an additional material (e.g. a metal or a plastic) to the substrate that has a higher rigidity than the substrate. In certain embodiments, the rigidity can be provided by blending a reinforcing additive to the substrate along the target section of the substrate during manufacturing. In certain embodiments, the rigidity is provided by thickening or modifying the geometry of the substrate along the target section to increase rigidity. Provided that the width W of the rigid band 304 is small compared to the overall height of the display 300, it will not have a large impact preventing the display 300 from rolling. In certain embodiments, the width of the rigid band 304 is one inch or less. In certain embodiments, the display 300 is configured to temporarily turn off so that it is not in operation when being rolled, so that movement of the rigid band 304 will not impact display performance.

In certain embodiments, a first rigid band 304 of drivers is positioned along top edge of the substrate perimeter 312 and a second rigid band 308 of drivers is positioned along an opposing edge of the substrate perimeter 314. The first and second rigid bands 304, 308 do not have to extend the entire length of the substrate 302. In one embodiment, the first and second rigid bands 304, 308 are positioned parallel to each other outside the display active area 310 while extending along staggered or offset lengths of the substrate 302. In one embodiment, the first rigid band 304 of drivers includes data driver chips while the second rigid band 308 of drivers includes chips for video processing, connectivity, and timing control.

In one embodiment, to view the display as a television external power will need to be provided, as well as video information. Electrical power can be provided through an external connection 306 (for example, through a socket provided near to an edge of the display). In one embodiment, the display has ten or less external connections, preferably, five or less external connections, more preferably, three or less external connections. Video information could be provided wirelessly by Bluetooth or wifi connectivity. This will reduce the number of external connections to a minimum, enhancing reliability and the rollability of the screen. In certain embodiments, at least one rigid band of drivers contains communication electronics and antennae needed for Bluetooth or wifi connectivity. Additional sets of video processing, rf connectivity, timing controller and computing chips can be attached to the display. In certain embodiments this is accomplished by placing these chips in another band parallel to the data driver band, and preferably placed towards an end of the display opposite or spaced out from where rigid bands are already present (e.g. at the bottom of the display assuming a data driver band is located near the top of the display).

The display according to embodiments disclosed here can include an active area of at least 40 inches diagonal, and can be smaller or larger. The display is capable of being rolled around an axis parallel to the length of the at least one rigid band of drivers to a diameter of less than 8 inches and in certain embodiments, to a diameter of less than 6 inches. The display can have a resolution of at least 50 dpi or more.

Product utilizing the display may include but are not limited to a flat panel display, a computer monitor, a medical monitor, a television, a touchscreen, a retractable projector screen, a billboard, a general illumination device, a signal, a heads up display, a fully transparent display, a large area wall, a theater, a stadium screen, a virtual reality display, an augmented reality display, and a sign. In certain embodiments, to view the display it will need to be unrolled and either made flat or else curved about a vertical axis in the middle of the display, depending on user preference. A frame can be used which would attach to the back of the display, and in certain embodiments could be held magnetically. The display could also roll-out similar to a projection screen that is pulled-down for viewing. In this case, the data drivers and other components described above can be housed in at least one of a top rigid housing (the housing that stores the screen when rolled-up) and/or a bottom rigid housing (the pull-down bar). Advantageously, these rigid sections are already standard structural components of conventional projector screens.

Shipping and transporting displays according to the embodiments described herein has many advantages since the television can be shipped either flat or in a rolled state. For example, from the display module maker to the TV set manufacturer, since shipping is normally via a large enclosed truck, the preferred shipping mode may be to have all the displays lay flat so that multiple displays could be shipped per box. However, shipping from retailer to consumer in certain instances would best be accomplished in a rolled state, allowing the television to be easily fit into a tube. In certain embodiments, the tube has a diameter of between 6 inches and 15 inches. In certain embodiments, the members of the support frame (e.g. collapsed, assembled or assembled) could fit inside the rolled up display, or could otherwise be boxed separately. Without the display's ability roll-up, it would be very difficult to fit a large display into a small car, however, a cylindrical tube containing the display could would easily fit into most small vehicles. The tube could even include a shoulder strap for easy carrying and transport by foot or bike. For very large displays that exceed the maximum interior length of the transport motor vehicle, the tube could also include brackets that could be secured to a roof rack of a vehicle. Aerodynamic tips (e.g. conical tips) could be attacked to the front and back ends of the tube to stabilize the tube at higher speeds. Moreover, as more and more shipping companies consider shipment by drone, a rolled up TV is a beneficial form factor that could be employed by a drone delivery means since it would not be aerodynamic to fly by drone in a flat format.

In one embodiment, the flexible substrate utilizes a material having a glass transition temperature of less than 200 degrees Celsius. To avoid cracking or delamination from flexing or rolling stresses, it is beneficial to minimize the temperature cycling through which the display is subjected to through fabrication or use. These constraints benefit from the use a low temperature TFT technology, preferably below 200 degrees Celsius or even below 180 degrees Celsius or less to be compatible with heat stabilized PEN substrates. In certain embodiments, organic TFTs, or low temperature oxide TFTs, or TFTs based on carbon nanotubes are utilized in the backplane. A permeation barrier can be positioned between the backplane and the frontplane. In certain embodiments, after fabricating the OLED devices, the display is encapsulated and further protected by laminating an overcoat to the encapsulated display. The OLED frontplane can be made using conventional methods of depositing full color OLED displays, including vapor or solution deposition. Full color OLED displays can also implement RGB side by side, white plus color filter or yellow/blue plus color filter, using standard VTE, OVPD or OVJP mask less printing techniques. In addition, the display could be a hybrid display containing both OLED sub-pixels and micro-LED sub-pixels, such as described in U.S. patent application Ser. No. 14/858,875, which is incorporated by reference in its entirety. Touch functionality may also be added, either by being embedded into each pixel or laminated over the display.

Figure 4:
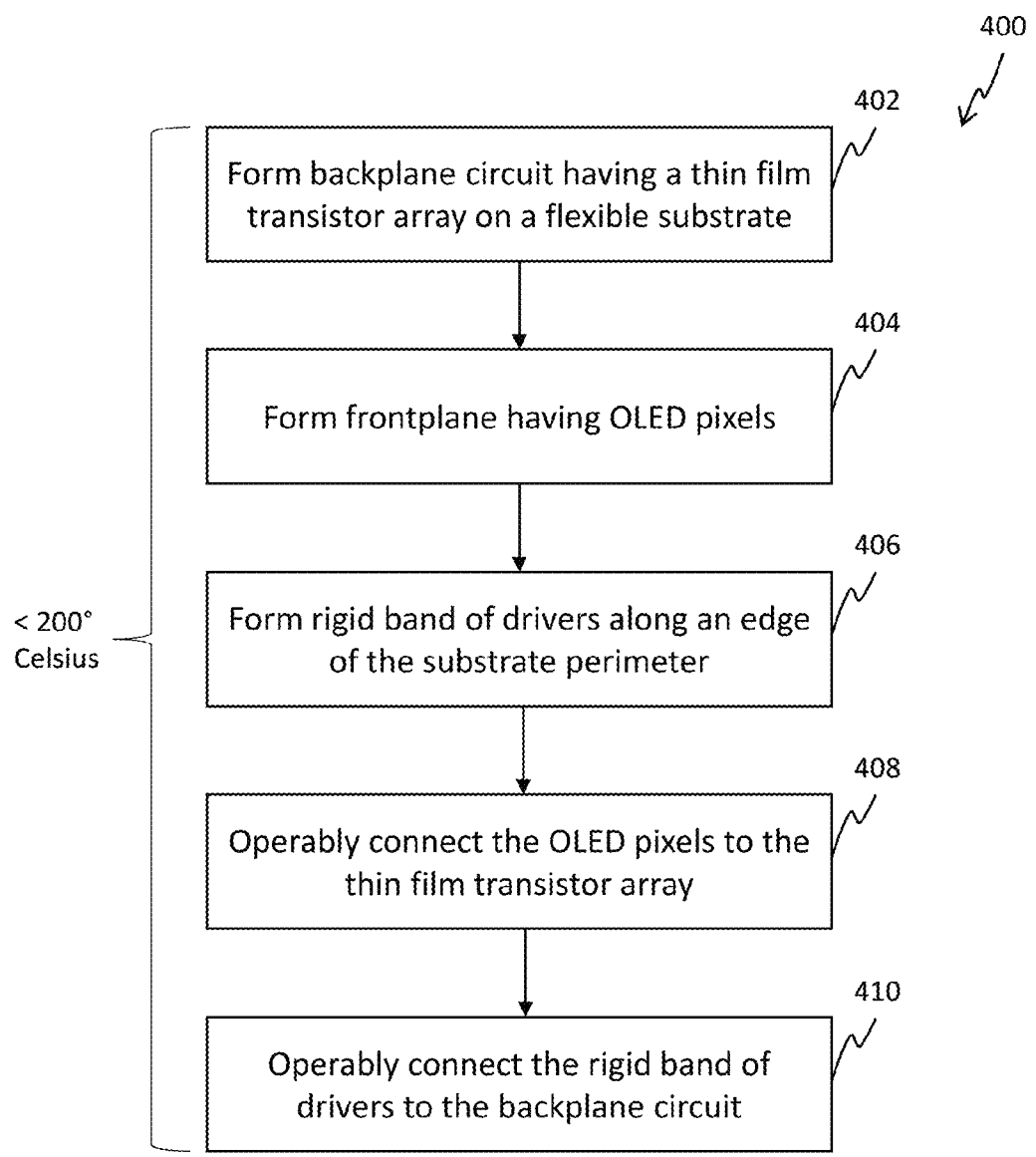
FIG. 4 is a flow chart of a method of fabricating a rollable display according to one embodiment.

With reference now to FIG. 4, a method 400 of fabricating a rollable display is shown according to one embodiment. A backplane circuit is formed including a thin film transistor array on a flexible substrate 402. A frontplane is formed including multiple OLED pixels 404. At least one rigid band of drivers is formed along an edge of the substrate perimeter 406. The OLED pixels are operably connected to the thin film transistor array 408. At least one rigid band of drivers is operably connected to the backplane circuit 410. The rollable display is fabricated at a temperature of less than 200 degrees Celsius. A barrier layer can be disposed between the frontplane and the backplane circuit. In one embodiment, the method includes the step of planarizing the backplane circuit. In one embodiment, the method includes the step of passivating the backplane circuit. A thin film barrier can be disposed over the plurality of OLED pixels. In one embodiment, the step of forming at least one rigid band of drivers includes forming a first rigid band of drivers positioned along an edge of the substrate perimeter and forming a second rigid band of drivers positioned along an edge of the substrate perimeter opposing the first rigid band of drivers.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting. The disclosures of each and every patent, patent application, and publication cited herein are hereby incorporated herein by reference in their entirety.

We claim:

1. A rollable display, comprising:
a frontplane comprising a plurality of OLED pixels;
a backplane comprising a flexible substrate having a perimeter and a thin film transistor array operably connected to the plurality of OLED pixels; and
at least one rigid band of drivers operably connected to the backplane and positioned along or near an edge of the substrate perimeter;
wherein the flexible substrate comprises a material having a glass transition temperature of less than 200 degrees Celsius; and
wherein the at least one rigid band of drivers comprises a first rigid band of drivers positioned along an edge of the substrate perimeter and a second rigid band of drivers positioned along an edge of the substrate perimeter.

2. The display of claim 1, wherein the at least one rigid band comprise a material having a rigidity that is greater than the backplane substrate.

3. The display of claim 1, wherein the width of the at least one rigid band is less than one inch.

4. The display of claim 1, wherein the second rigid band of drivers is parallel to the first band of rigid drivers.

5. The display of claim 1, wherein the first rigid band of drivers comprise data driver chips.

6. The display of claim 5, wherein the second rigid band of drivers comprise chips for video processing, connectivity, and timing control.

7. The display of claim 1, further comprising a permeation barrier disposed between the backplane and the frontplane.

8. The display of claim 1, wherein the display includes an active area of at least 40 inches diagonal.

9. The display of claim 1, wherein the display is greater than 50 dpi.

10. The display of claim 1, wherein the flexible substrate comprises a material having a glass transition temperature of less than 180 degrees Celsius.

11. A product comprising the display of claim 1, wherein the product is selected from the group consisting of: a flat panel display, a computer monitor, a medical monitor, a television, a touchscreen, a retractable projector screen, a billboard, a general illumination device, a signal, a heads up display, a fully transparent display, a virtual reality display, an augmented reality display, a large area wall, a theater, a stadium screen, and a sign.

12. A rollable display, comprising:
a frontplane comprising a plurality of OLED pixels;
a backplane comprising a flexible substrate having a perimeter and a thin film transistor array operably connected to the plurality of OLED pixels; and
at least one rigid band of drivers operably connected to the backplane and positioned along or near an edge of the substrate perimeter;
wherein the flexible substrate comprises a material having a glass transition temperature of less than 200 degrees Celsius;
wherein the display includes an active area of at least 40 inches diagonal; and wherein the display is capable of being rolled around an axis parallel to the length of the at least one rigid band of drivers to a diameter of less than 8 inches.

13. A method of fabricating a rollable display, comprising:
forming a backplane circuit comprising a thin film transistor array on a flexible substrate;
forming a frontplane comprising a plurality of OLED pixels;
forming at least one rigid band of drivers along an edge of the substrate perimeter;
operably connecting the plurality of OLED pixels to the thin film transistor array; and
operably connecting the at least one rigid band of drivers to the backplane circuit;
wherein the rollable display is fabricated at a temperature of less than 200 degrees Celsius; and
wherein the step of forming at least one rigid band of drivers comprises forming a first rigid band of drivers positioned along an edge of the substrate perimeter and forming a second rigid band of drivers positioned along an edge of the substrate perimeter opposing the first rigid band of drivers.

14. The method of claim 13, further comprising disposing a barrier layer between the frontplane and the backplane circuit.

15. The method of claim 13, wherein the at least one rigid band comprises a material having a rigidity that is greater than the backplane substrate.

16. The method of claim 13, wherein the width of the at least one rigid band is less than one inch.

17. The method of claim 13, wherein the display is capable of being rolled around an axis parallel to the length of the at least one rigid band of drivers to a diameter of less than 8 inches.

18. The method of claim 13, wherein the display is fabricated at a temperature of less than 180 degrees Celsius.

* * * * *